(12) United States Patent
Yokoyama et al.

(10) Patent No.: US 7,414,363 B2
(45) Date of Patent: Aug. 19, 2008

(54) ORGANIC EL DISPLAY DEVICE AND METHOD FOR FABRICATING THE SAME

(75) Inventors: Mika Yokoyama, Yokohama (JP); Kunio Masumo, Yokohama (JP); Naoki Kato, Yokohama (JP)

(73) Assignee: OPTREX Corporation, Tokyo (JP)

( * ) Notice: Subject to any disclaimer, the term of this patent is extended or adjusted under 35 U.S.C. 154(b) by 426 days.

(21) Appl. No.: 11/315,486

(22) Filed: Dec. 23, 2005

(65) Prior Publication Data

US 2006/0158077 A1    Jul. 20, 2006

(30) Foreign Application Priority Data

Dec. 24, 2004    (JP)    ............................. 2004-374720

(51) Int. Cl.
*H01J 1/62*    (2006.01)
(52) U.S. Cl. ...................................... 313/507; 313/506
(58) Field of Classification Search ................. 313/498, 313/504–506, 509, 512
See application file for complete search history.

(56) References Cited

U.S. PATENT DOCUMENTS

| 7,199,516 | B2 * | 4/2007 | Seo et al. | ..................... 313/504 |
| 7,215,075 | B2 * | 5/2007 | Kurata | ........................ 313/506 |

* cited by examiner

*Primary Examiner*—Vip Patel
(74) *Attorney, Agent, or Firm*—Oblon, Spivak, McClelland, Maier & Neustadt, P.C.

(57) ABSTRACT

An organic EL display device includes color filters 102, an overcoat layer 103 and an inorganic solid layer 104 disposed on a substrate 101; a first electrodes 105, an organic film 107 and a second electrodes 108 disposed on the inorganic solid layer 104; an insulating layer 106 disposed so as to cover edge portions of the first electrodes. The organic EL display device can improve production yield and restrain visual failure from being caused with the lapse of time by including a protection layer 109 so as to prevent the inorganic solid layer 104 from being damaged.

10 Claims, 9 Drawing Sheets

ORGANIC EL DISPLAY DEVICE AND METHOD FOR FABRICATING THE SAME

FIELD OF THE INVENTION

The present invention relates to an organic electroluminescence (hereinbelow, abbreviated to EL in Description) display device, and a method for fabricating the same.

DISCUSSION OF BACKGROUND

The organic EL panel to be used in an organic EL display includes an organic film sandwiched between electrodes, the organic film comprising an organic compound. The organic compound emits light by flowing an electrical current between both electrodes. One of the methods for configuring such an organic EL display as a full-color display is a technique using a color filter system. This type of organic EL display device has been disclosed in, e.g., JP-A-9-212106.

In the technique that uses a color filter system to configure an organic EL display as a full-color display, an organic EL element, which emits white light, is combined with color filter layers of three primary colors to realize a full-color organic EL display. FIG. 9 is a schematic view of a portion of a conventional organic EL display device 2. As shown in FIG. 9, the conventional organic EL display device 2 comprises a glass substrate 201, color filters 202 of RGB (red, green and blue) disposed on the glass substrate, and an overcoat layer 203 disposed on the color filters, the overcoat layer being made of a transparent resin, such as an acrylic resin.

Additionally, the overcoat layer has an inorganic solid layer 204 disposed thereon in order to prevent the organic EL element from being deteriorated by a slight amount of moisture, a solvent or an organic compound contained in the color filters 202 and the overcoat layer 203. The inorganic solid layer has transparent conductive layers (anodes) 205 disposed and patterned thereon, and the inorganic solid layer and the transparent conductive layers are covered with an insulating film 206 having openings formed therein. The insulating film has an organic film 207 deposited thereon so as to emit white light, and the organic film has cathodes 208 disposed thereon. When an electrical current flows between a transparent conductive layer (anode) 205 and a cathode 208, the organic film 207 emits white light. The white light, which has been emitted from the organic film 207, passes through the transparent conductive layer (anode) 205 and a color filter 202 transparent conductive layer (anode) 205. The white light enters a desired one of the color filets 202 of RGB to emit a desired color of R, G or B, configuring the organic EL display device as a full-color display. Each of the layers below the organic film 207, i.e., the transparent conductive layers (anodes) 205, the inorganic solid layer 204, the overcoat layer 203 and the glass substrate 201, is made of a transparent material. The organic EL display device also includes supplemental wires to be connected to the cathodes 208, which are not shown in FIG. 9.

The inorganic solid layer 204 protects the organic EL element from the moisture and/or the organic compound as stated above. The inorganic solid layer plays a quite important role in terms of having an effect on yield. When the inorganic solid layer 204 is incompletely disposed, display characteristics are changed. For example, there has been known a problem that since an organic EL element is deteriorated with the lapse of time after completion of the element, non-luminous portions R are caused as shown in FIG. 10. The inorganic solid layer 204 plays a quite important role to protect an organic layer from moisture and/or an organic compound in the organic EL display device. In FIG. 10, the transparent conductive layers (anodes) 205 shown in FIG. 9 are indicated by dotted lines, and separators 111 for formation of the separated cathodes are disposed so as to extend perpendicular to the cathodes.

SUMMARY OF THE INVENTION

The conventional organic EL display device stated above has caused the following problem. In the process for fabricating the above-mentioned organic EL display device, in order to remove foreign materials adhering as defect materials on the substrate, the transparent conductive layers (anodes) 205 for the anodes and unshown metal films for the supplemental wires are normally cleaned after being patterned. Cleaning is performed with, e.g., a high dense brush, supplying pressurized ultrapure water. In some cases, a portion of the inorganic solid layer 204, which is exposed in a surface to clean, is damaged during cleaning. When the inorganic solid layer 204 is damaged, the inorganic solid layer cannot completely play the quite important role, which prevents the organic EL element from being deteriorated by moisture and/or an organic compound as stated above. This problem is significant in particular when the inorganic solid layer is formed so as to have a small thickness. This problem has been also caused in an organic EL display adopting a CCM (color changing material) system.

It is an object of the present invention to solve the problem and to provide an organic EL display device, and a method for fabricating the same, which are capable of preventing an inorganic solid layer from being damaged during a cleaning step in a process for fabricating the organic EL display device, improving the yield of the organic EL display and being so robust as to restrain visual failure from being caused with the lapse of time.

According to a first aspect of the present invention, there is provided an organic EL display device comprising a substrate; a color organic material layer disposed on the substrate; an overcoat layer covering the color organic material layer; an inorganic solid layer disposed on the overcoat layer; a plurality of first electrodes, an organic light-emitting layer and a plurality of second electrodes disposed on the inorganic solid layer; a light-emitting portion, the light-emitting portion comprising a region of the organic light-emitting layer, where a first electrode and a second electrode overlap each other, and which is brought into contact with the first electrode and the second electrode; an insulting film disposed so as to cover end portions of the first electrodes close to adjacent first electrodes and gap portions between adjacent first electrodes; and a protection layer disposed so as to cover an inorganic solid layer on the substrate as much as possible except areas of the first electrodes, the protection layer being patterned so as not to be short-circuited with the first electrodes when the protection layer comprises a conductive material.

According to a second aspect of the present invention, the protection layer is disposed outside an active area in the organic EL display device according to the first aspect. By this arrangement, the inorganic solid layer is prevented from being damaged by a cleaning step since exposed portions of the inorganic solid layer outside an active area is protected by the protection layer. Accordingly, it is possible to prevent the occurrence of a case wherein a foreign material, which is generated on a damaged exposed portion of the inorganic solid layer, causes visual failure, or moisture, a solvent or the like diffuses into an active area through a damaged portion, causing visual failure.

According to a third aspect of the present invention, the protection layer is conductive and is disposed so as to be insulated from the first electrodes in the organic EL display device according to the second or third aspect. By this arrangement, the first electrodes and the protection layer can be disposed from the same material and in the same layer.

According to a fourth aspect of the present invention, the protection layer is disposed so as to cover a whole region where the overcoat layer is disposed in the organic EL display device according to the first aspect. By this arrangement, it is possible to properly protect portions, which are likely to be damaged by the cleaning step.

According to a fifth aspect of the present invention, the protection layer and the first electrodes are layers to be processed by the same step in the organic EL display device according to the first, second, third or fourth aspect. By this arrangement, it is possible to decrease the number of the steps in the fabrication process.

According to a sixth aspect of the present invention, the organic light-emitting layer emits white light, and the color organic material layer comprises color filters of R, G and B in the organic EL display device according to any one of the first to fifth aspects.

According to a seventh aspect of the present invention, the organic light-emitting layer and the color organic material layer have at least a kind of color-converting layer disposed therebetween, said color-converting layer being capable of converting original emitting light to a different color light according to any one of the first to fifth aspects.

According to an eighth aspect of the present invention, there is provided a method for fabricating an organic EL display device, comprising disposing a color organic material layer on a substrate; disposing an overcoat layer so as to cover the color organic material layer; disposing an inorganic solid layer on the overcoat layer; disposing a plurality of first electrodes on the inorganic solid layer; disposing a protection layer on the inorganic solid layer and outside the first electrodes; cleaning the substrate from above the first electrodes and the protection layer; disposing an insulating film on the first electrodes, the insulating film having openings; disposing an organic light-emitting layer; and disposing a plurality of second electrodes on the organic light-emitting layer disposed on the first electrodes. By this arrangement, it is possible to provide an organic EL display device, which protects the inorganic solid layer by the protection layer to make it difficult to cause visual failure with the lapse of time and to restrain the inorganic solid layer from being damaged by cleaning in the cleaning step.

According to a ninth aspect of the present invention, the method according to the eighth aspect further comprises disposing the first electrodes and the protection layer by the same step. By this arrangement, it is possible to provide an organic EL display device, which is superior in terms of productivity and cost.

According to a tenth aspect of the present invention, the method according to the eighth aspect further comprises disposing separators to separate the second electrodes from one another. By this arrangement, it is possible to properly dispose the second electrodes.

In accordance with the present invention, it is possible to provide an organic EL display device, and a method for fabricating the same, which are capable of improving the yield of the organic EL display and being difficult to be subjected to visual failure with the lapse of time.

BRIEF DESCRIPTION OF THE DRAWINGS

A more complete appreciation of the invention and many of the attendant advantages thereof will be readily obtained as the same becomes better understood by reference to the following detailed description when considered in connection with the accompanied drawings, wherein.

DETAILED DESCRIPTION OF THE PREFERRED EMBODIMENTS

Now, embodiments, to which the present invention is applicable, will be described. The following explanation will be made only for the purpose of describing embodiments of the present invention, and the present invention is not limited to the embodiments described below.

Figure 1A:
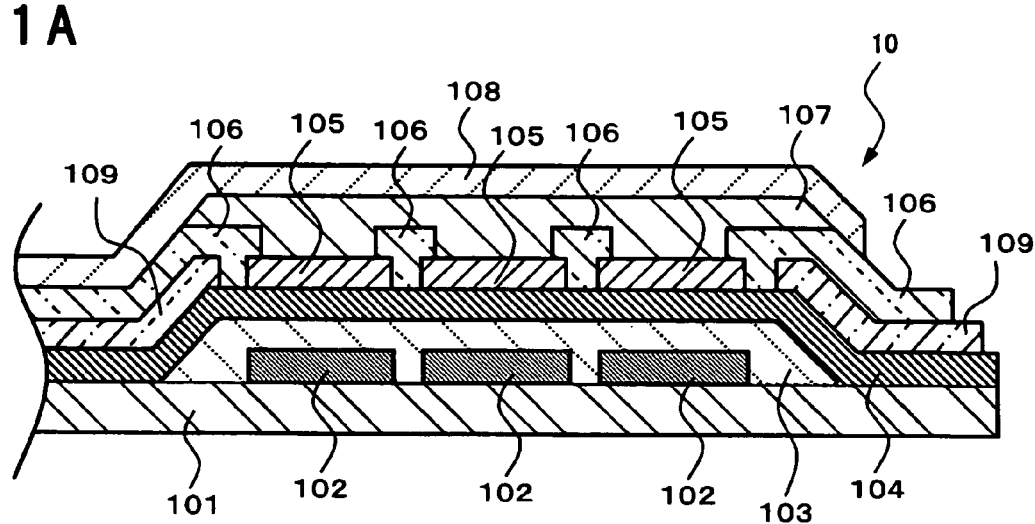
FIGS. 1A and 1B are cross-sectional views showing the organic EL panel according to an embodiment of the present invention.

FIG. 1A is a cross-sectional view showing a portion of the organic EL panel 10 according to an embodiment of the present invention. As shown in this figure, color filters 102 of RGB (red, green and blue) are disposed on a glass substrate 101, and an overcoat layer 103 are disposed on the color filters and the glass substrate. An inorganic solid layer 104 is disposed on the overcoat layer in order to prevent the organic EL element from being deteriorated by a slight amount of moisture, a solvent, a compound or the like contained in the color filters 102 and the overcoat layer 103. The inorganic solid layer 104 also has an effect to improve the adhesion with transparent conductive layers 105 to be formed thereon. Protection patterns 109 and the transparent conductive layers 105 are disposed on the inorganic solid layer 104. And, an insulating film 106, which has openings formed therein is deposited in desired areas in order to protect pattern edges of the transparent conductive layers 105 and to separate pixels from one another. Further, separators (not shown) having an inverted tapered shape are disposed in order to separate cathodes during disposition of the cathodes. Organic films 107 are deposited from above the separators, and the cathode 108 is disposed on the organic films and separated by separators. The organic EL panel is configured to have such a multilayer structure.

An organic EL display device is normally configured as a passive matrix display, using the transparent conductive layers 105 and the cathodes 108 as signal electrodes and scanning electrodes, respectively. This is because it is easy to fabricate such a passive matrix display in terms of formation of the panel. Conversely, the transparent conductive layers 105 and the cathodes 108 may be disposed as scanning electrodes and signal electrodes, respectively. When an electrical current flows through the organic film 107 in an opening formed in the insulating film 106, the organic film 107 in this region emits light. In other words, the organic film 107 in an opening functions as a light-emitting portion. A region, where plural light-emitting portions are formed in a matrix shape, functions as an active area in its entirety.

The glass substrate 101 is a supporter of the organic EL panel 10. Although the glass substrate in this embodiment is transparent, the present invention is not limited to this substrate. A plastic substrate with a moisture-resistant coating applied thereon may be used. When a glass substrate is used, a soda lime glass substrate with an alkali barrier or non-alkali glass substrate may be used in many cases. When a plastic substrate is used, a polycarbonate substrate, a polymethacrylate substrate, a polystyrene substrate or the like may be used.

The color filters 102 are made of a colored resin and are formed in plural rectangular or other patterns, which are separated from one another. The respective rectangular pattern are disposed so as to correspond to respective areas functioning as pixels. The color filters 102 comprise color filters for three colors of RGB as stated above. The color filters are disposed at positions corresponding the respective pixels. For this reason, when the color filters 102 have been patterned, thickness variations are caused since the color filters have different thicknesses. The overcoat layer 103 is disposed in order to mitigate the thickness variation of color filters. Although the color filters 102 are disposed so as to be separated from one another in this embodiment, the color filters may be disposed so as to have a pattern wherein the color filters are flush with one another without a gap between adjacent color filters. As stated above, the thickness variations by the presence of the color filters 102 are eliminated by disposing the overcoat layer 103. The thickness variations may also be eliminated by polishing after formation of the color filters.

Although the overcoat layer 103 is made of a material, such as an acrylic resin, there is no limitation to the material for the overcoat layer. It should be noted that the overcoat layer 103 needs to be transparent so that the light-emitting portions can be seen from outside. As the method for disposing the overcoat layer, conventional methods are available.

The color filters 102 and the overcoat layer 103 are likely to hold moisture and/or an organic material, such as an organic solvent, since these members are layers made of organic materials (organic material layers) as stated above. Moisture and/or an organic material, which is generated from these organic material layers when the transparent conductive layers 105 are disposed by, e.g., sputtering, hinders the transparent conductive layers 105 from being deposited as good films in some cases. It has been known that moisture and/or an organic material diffuses into an organic film 107 disposed on a transparent conductive layer 105 and that the diffusion in an organic film can deteriorate the light-emission property.

It is preferred from the viewpoint of improving the adhesion between the organic material layers and the transparent conductive layers 105 that the inorganic solid layer 104 be made of a silicon oxide. Although it is preferred from the viewpoint of preventing the moisture or the organic material from diffusing that the inorganic solid layer be made of silicon nitride, the inorganic solid layer may be also made of a composition of a silicon oxide and a silicon nitride with the ratio of $SiO_x/SiN_x$ optimized in order to have both of transparency and a gas barrier property in many cases. The inorganic solid layer 104 has a permeable area formed therein so that the moisture and/or the organic material is evaporated through the permeable route during the process of drying the substrate. However, after fabrication, under a usual condition of a panel, moisture, an organic material and/or a compound cannot pass through the permeable area. The inorganic solid layer has a preferred thickness of 1 to 20 nm or below for example, and the inorganic solid layer is disposed as a quite thin film.

The transparent conductive layers 105 are disposed by depositing, e.g., an ITO (indium tin oxide) thin film so as to have a thickness of about 150 nm and are patterned by wet etching in this embodiment. For this reason, a cleaning step is required after patterning. After patterning the transparent conductive layers 105, some portions of the inorganic solid layer 104 are exposed. In some cases, the inorganic solid layer 104 is damaged when the cleaning process is performed by, e.g., pressing a high dense brush while supplying pressurized ultrapure water. Since the inorganic solid layer is disposed as a quite thin film as stated above, the inorganic solid layer not only is difficult to play the above-mentioned role but also causes visual failure, once it is damaged.

Figure 1B:
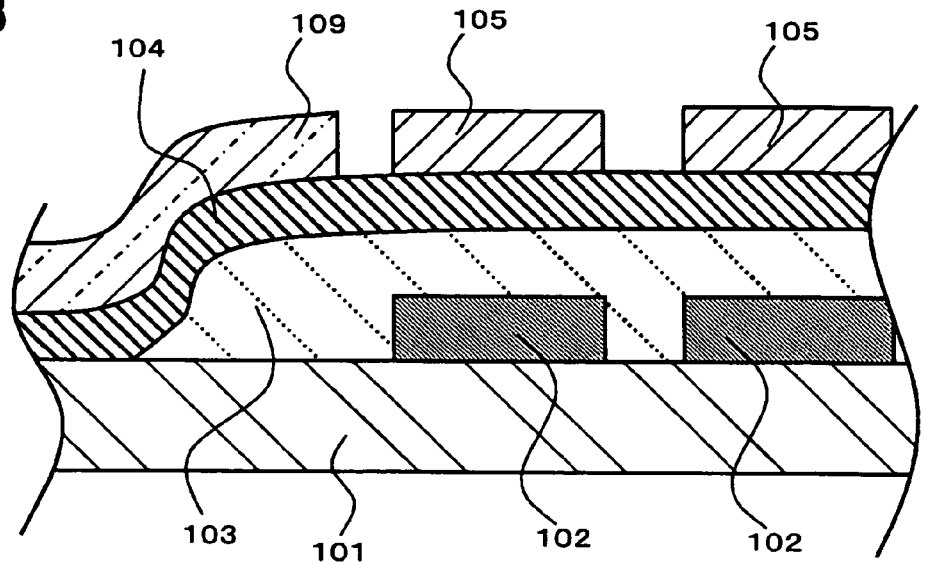

In FIG. 1B as an enlarged view of a portion of the organic EL panel 10, only the color filters 102, the overcoat layer 103, the inorganic solid layer 104, the transparent conductive layers 105 and the protection patterns 109 are shown as the elements of the organic EL panel shown in FIG. 1A. As shown in FIG. 1B, the color filters 102 are covered with the overcoat layer 103, and the transparent conductive layers 105 are disposed and patterned at positions corresponding to the respective color filters 102. In the present invention, the protection patterns 109 are disposed on the inorganic solid layer 104 independently from the transparent conductive layers 105 for the purpose of covering a region having no color filters 102. And, the protection pattern 109 covers a whole area of the overcoat layer 103, in particular a pattern edge region of the overcoat layer 103. The protection patterns 109 may be disposed by the same ITO as the transparent conductive layers 105, such as ITO. By disposing the protection patterns 109, the underneath inorganic solid layer 104 can be protected from damage, such as damage caused by the brush in the cleaning process. The transparent conductive layers 105 are patterned at such positions to function as electrodes while the protection patterns 109 are patterned at such positions not to function as electrodes.

From this viewpoint, it is preferred that the transparent conductive layers 105 and the protection patterns 109 be disposed at a gap to prevent the inorganic solid layer 104 from being damaged during the cleaning process, in other words, at such a gap that a high dense brush is prevented from entering. The transparent conductive layers and the protection patterns are patterned at such a optimum gap that the moisture and/or an organic compound coming from the color filters 102 and the overcoat layer 103 can evaporate in a drying process. However, when the gap is too wide, the inorganic solid layer 104 has wider exposed portions and is damaged in the cleaning process. On the other hand, when the gap is too narrow, it is difficult to sufficiently evaporate the moisture and/or the organic compound during the drying process. In a case where the protection patterns 109 are made of ITO as stated above, when the gap is too narrow, a transparent conductive layer 105 and its adjacent protection pattern 109, which are also conductive, are short-circuited in some cases.

The transparent conductive layers 105 are the anode electrodes of the organic EL display device. The protection patterns 109 are patterns for protecting the inorganic solid layer 104 stated above. Although the protection patterns 109 are distinguished from the transparent conductive layers 105 in terms of role, the protection material and the transparent conductive material may be disposed and patterned by the same process. In this case, the protection patterns 109 need to be disposed, being insulated from the transparent conductive layers 105, since the protection patterns are also conductive materials, such as ITO. When the transparent conductive layers 105 and the protection patterns 109 are patterned by the same process, two processes of film deposition and patterning for the protection patterns 109 are not required independently. As a result, productivity is improved.

When the transparent conductive layers 105 and the protection patterns 109 are patterned by different processes, there is a possibility that the substrate needs to be cleaned once after patterning the transparent conductive layers or the protection patterns. For this reason, an exposed portion of the inorganic solid layer 104 may be more damaged in some cases. From this viewpoint as well, it is preferred that the transparent conductive layers 105 and the protection patterns 109 be made of the same material and be patterned by the same process.

Although the insulating layer 106 having openings formed therein is normally made of a polymeric material, such as a polyimide resin, there is no particular limitation to the material for the insulating layer. The insulating layer may be made of a known material having a sufficient insulating property. The insulating layer 106 is disposed for the purpose of protecting the pattern edges of the transparent conductive layers 105 and separating the pixels from one another. The organic films 107 are disposed on the active area and its surrounding small area, and the respective openings are disposed so as to correspond to the respective overlapped portions of the transparent conductive layers 105 and the cathodes 108, forming the pixels.

As the material for the organic films 107, it is effective to use a compound having a high fluorescence yield, having a high injection rate of electrons from the cathodes 108 and having a high electron mobility. It is acceptable to use a known organic fluorescent material, such as an 8-oxinoline complex, tetraphenylbutadiene, styryl pigment or oxadiazol pigment.

The organic films 107 have a film thickness of normally from 10 to 200 nm, preferably from 20 to 80 nm. In normal cases, a light-emitting layer is accompanied by a hole transport layer, interface layers, an electron injection layer, an electron transport layer and the like. When these layers exist, it should be noted that the organic films 107 according to the present invention include these layers as well. Each of the cathodes may be made of, e.g., a thin metal film.

Figure 5G:
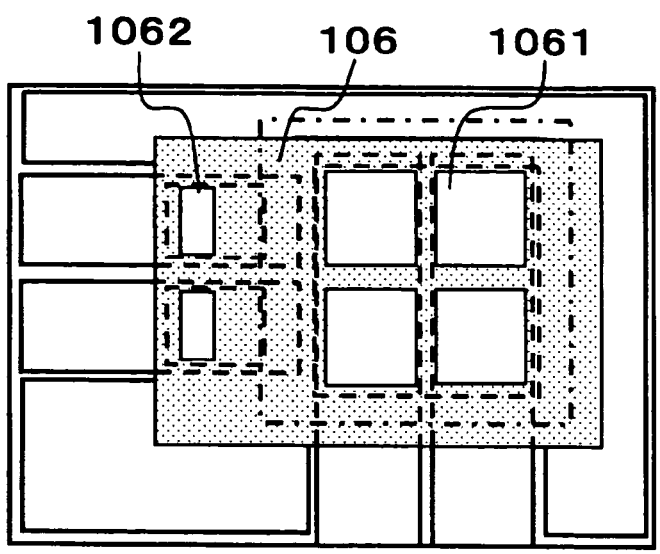
FIGS. 5G to 5I are top plan views schematically showing the process for fabricating the organic EL display device according to the embodiment.
Figure 5H:
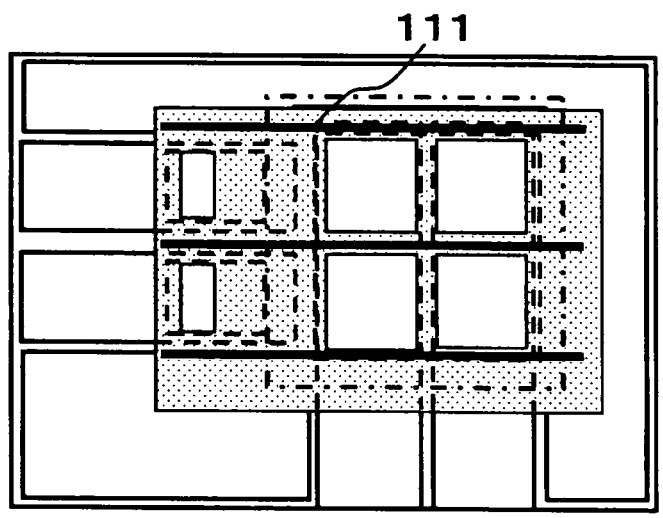
Figure 5I:
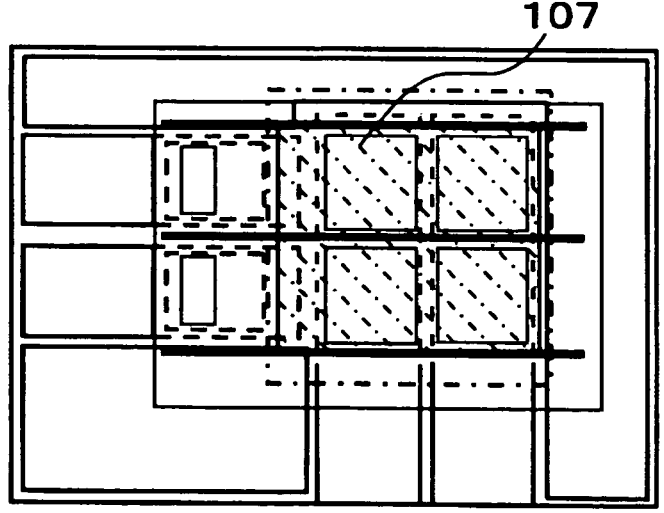
Figure 6J:
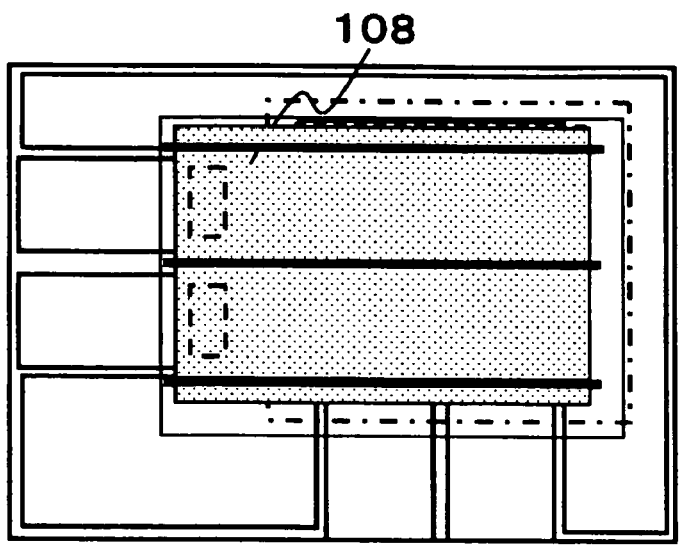
FIGS. 6J to 6L are top plan views schematically showing the process for fabricating the organic EL display device according to the embodiment.
Figure 6K:
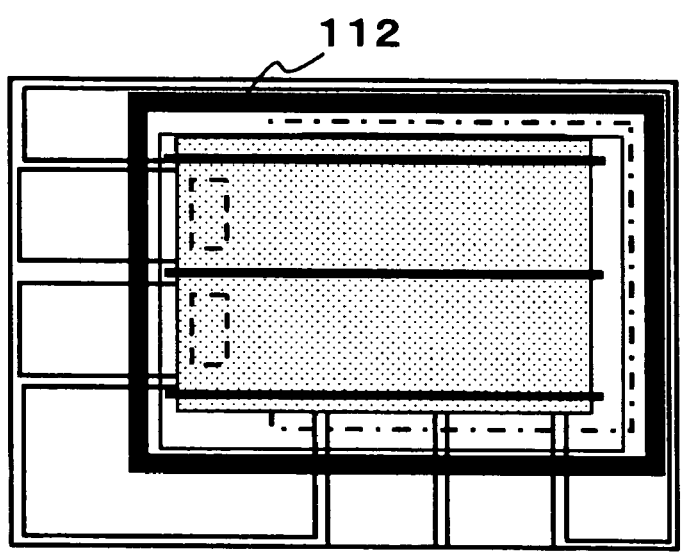
Figure 6L:
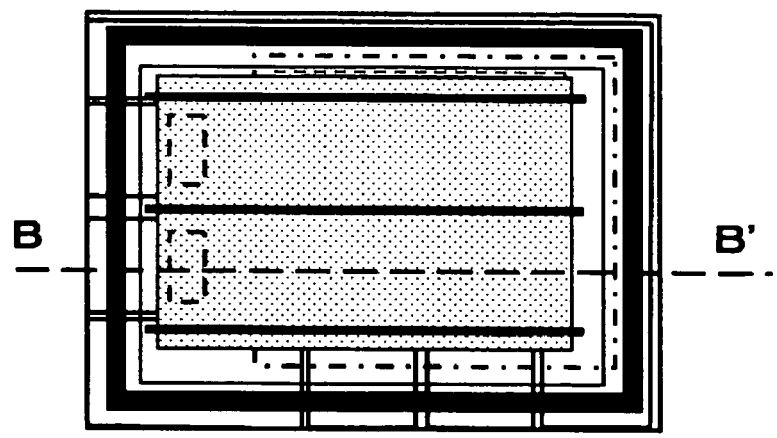
Figure 7:
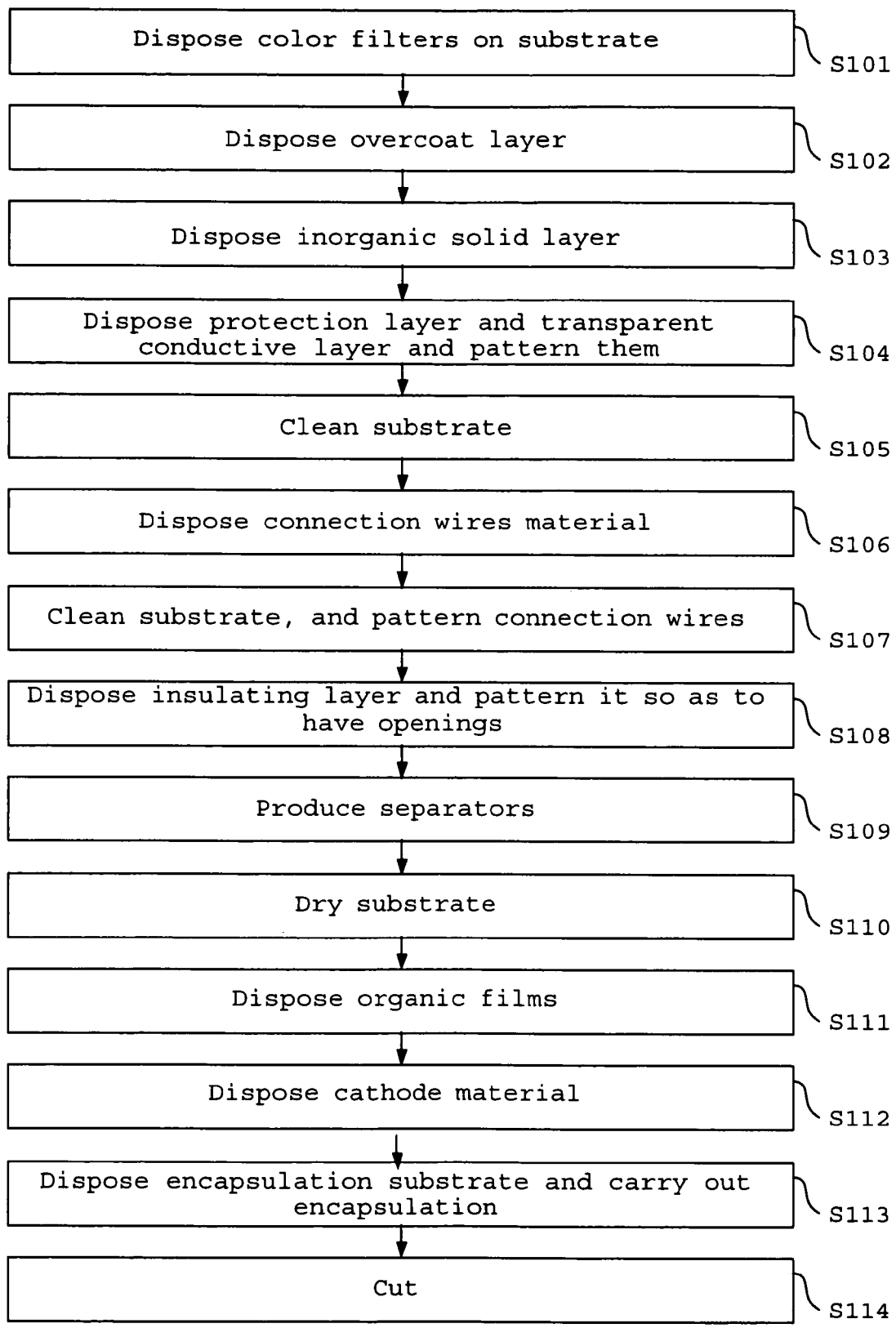
FIG. 7 is a flow chart showing the process for fabricating the organic EL display device according to the embodiment.

FIG. 2A to FIG. 3F, and FIG. 5G to FIG. 6L are top plan view showing processes for fabricating an organic EL display device containing the organic EL panel 10 according to this embodiment. FIG. 7 is a flow chart of the fabrication processes. Although only two rows and two columns of pixels of an organic EL panel are shown in FIG. 2A to FIG. 3F, and FIG. 5G to FIG. 6L for simplification, an actual product is not limited to have such a structure as shown in these figures. The process for fabricating the organic EL display device according to this embodiment will be described, referring to FIG. 2A to FIG. 6L and FIG. 7.

Figure 2A:
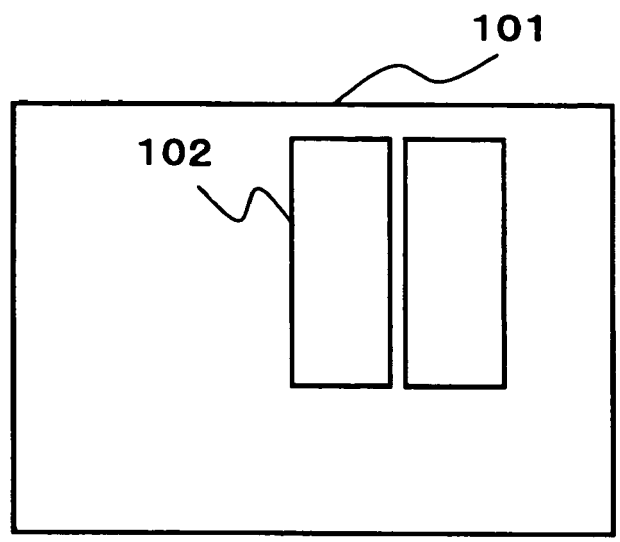
FIGS. 2A to 2C are top plan views schematically showing a process for fabricating the organic EL display device according to the embodiment.
Figure 2B:
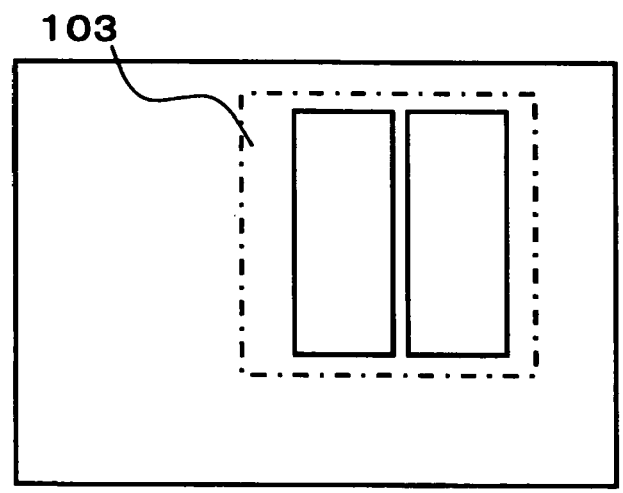

As shown in FIG. 2A, the color filters 102 are first disposed on the glass substrate 101 (S101 of FIG. 7). The color filters 102 have a film thickness of, e.g., 1.2 μm and are formed by wet-spin-coat method and disposed by photolithography. As shown in FIG. 2B, the overcoat layer 103 is subsequently deposited on the glass substrate 101 and patterned to cover a whole area of the color filters 102 by photolithography (S102 of FIG. 7). The overcoat layer 103 is deposited so as to cover the color filters 102, making the substrate surface flat. The overcoat layer 103 has a thickness of, e.g., 1.5 μm and is made of an acrylic resin.

Figure 2C:
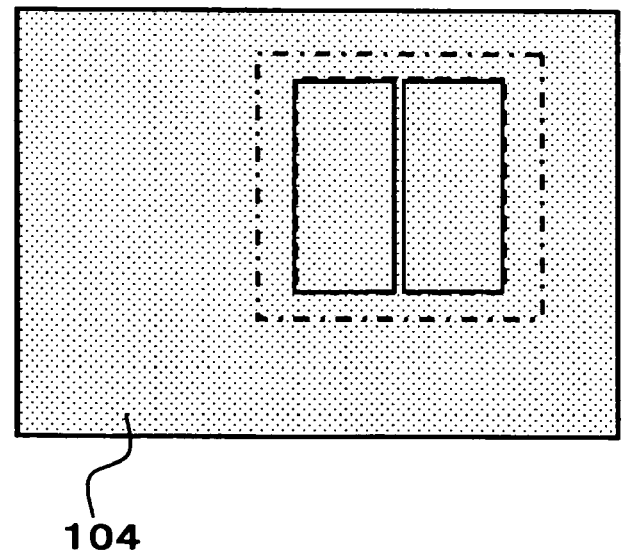

As shown in FIG. 2C, the inorganic solid layer 104 is subsequently deposited on top of the substrate (FIG. 2B) (S103 of FIG. 7). The inorganic solid layer 104 comprises $SiO_2$. It is preferred from the viewpoint of having both of transparency and a gas barrier property that the inorganic solid layer comprise a combination of a silicon oxide and silicon nitride with the ratio of $SiO_x/SiN_x$ optimized therein. The inorganic solid layer 104 is disposed by, e.g., sputtering. The inorganic solid layer 104 is properly controlled to have a thickness ranging, e.g., from 1 nm to 20 nm, although the thickness varies, depending on fabricating conditions. The thickness may be set at 5 nm. In this embodiment, the inorganic solid layer may be deposited as a thin film by RF sputtering under such conditions that the substrate temperature is 220° C., the target comprises $SiO_2$, argon gas is used as the sputtering gas, and the gas pressure is 0.7 Pa.

Figure 3D:
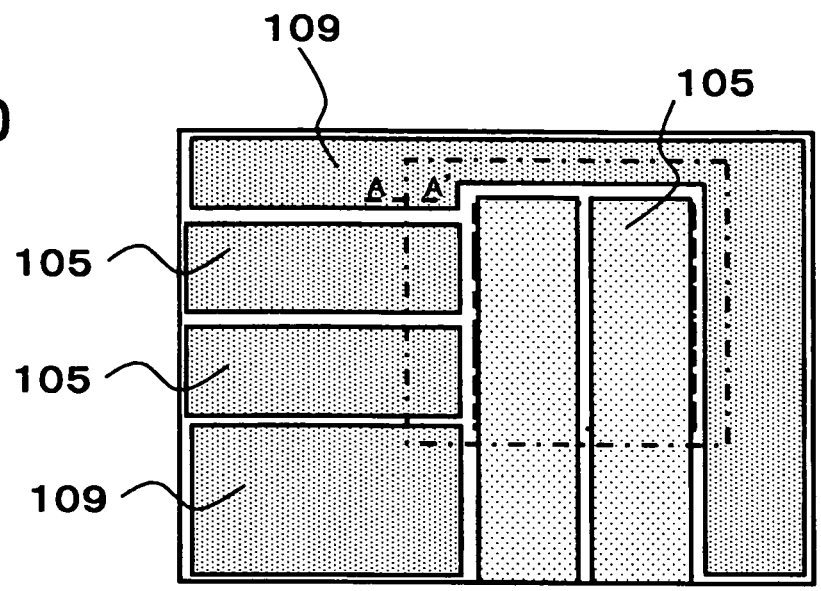
FIGS. 3D to 3F are top plan views schematically showing the process for fabricating the organic EL display device according to the embodiment.

An ITO film is deposited on the entire inorganic solid layer 104, and the protection patterns 109 and the transparent conductive layers 105 are patterned as shown in FIG. 3D (S104 of FIG. 7). Two rows of patterns on the left side among the transparent conductive layers 105 shown in FIG. 3D are patterned so as to be aligned with respective patterns of connecting wires 110 disposed later. Although the protection patterns 109 and the transparent conductive layers 105 are preferably disposed by the same step as stated above, the protection patterns and the transparent conductive layers may be disposed by different processes.

The protection patterns 109 are patterned on the inorganic solid layer 104 for the purpose of covering a region having no color filters 102. And the protection pattern 109 covers the whole area of the overcoat layer 103, in particular a pattern edge region of the overcoat layer 103. The protection patterns 109 may be disposed by the same transparent conductive layers 105, such as ITO. By disposing the protection patterns 109, the underneath inorganic solid layer 104 can be protected from damage, such as damage caused by the brush in the cleaning process. The transparent conductive layers 105 are patterned at such positions to function as electrodes while the protection patterns 109 are patterned at such a position not to function as electrodes. The reason why the moisture and/or the organic compound is removed is that the organic EL display device is free from visual failure by preventing the organic films 107 from being deteriorated. In some cases, it is preferred that the whole area except an area with the pixels disposed and areas in the vicinity of the pixels be covered with the protection patterns rather than have the moisture or the organic material removed by a drying process.

For example, the ITO film is deposited by DC sputtering under such conditions that the substrate temperature is 220° C., argon gas with 0.8% of oxygen added thereto is used as the sputtering gas, and the gas pressure is 0.7 Pa. The transparent conductive layers 105 and the protection patterns 109 are patterned by wet etching, using a solution comprising hydrochloric acid and ferric chloride. By this process, some portions of the inorganic solid layer 104 are exposed. For example, the transparent conductive layers 105 have a width of 50 μm, and the gap between adjacent transparent conductive layers 105 and the gap between a transparent conductive layer 105 and its adjacent protection pattern 109 have a width of 10 μm. The protection patterns 109 are patterned so as to cover the entire substrate as widely as possible for the purpose of protecting the inorganic solid layer 104 even in the region outside the pixels.

After that, the cleaning process is performed (S105 of FIG. 7). In other words, the cleaning step is performed in the state shown in FIG. 3D. Cleaning is conducted, supplying solvents, e.g., high-pressure ultrapure water. Foreign materials, such as undesirable particles, on the whole substrate surface can be removed by pressing a high dense brush against the whole substrate surface while rotating the substrate. At that time, the inorganic solid layer 104 can be prevented from being damaged by cleaning since the inorganic solid layer is covered with the protection patterns 109.

Figure 4A:
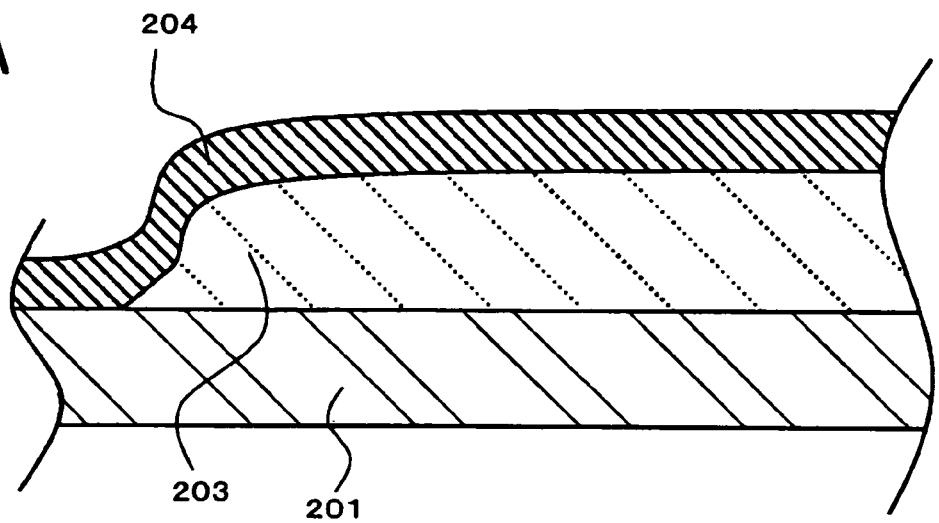
FIGS. 4A and 4B are cross-sectional view showing a portion of a conventional organic EL panel and a portion of the organic EL panel according to the embodiment, respectively.
Figure 4B:
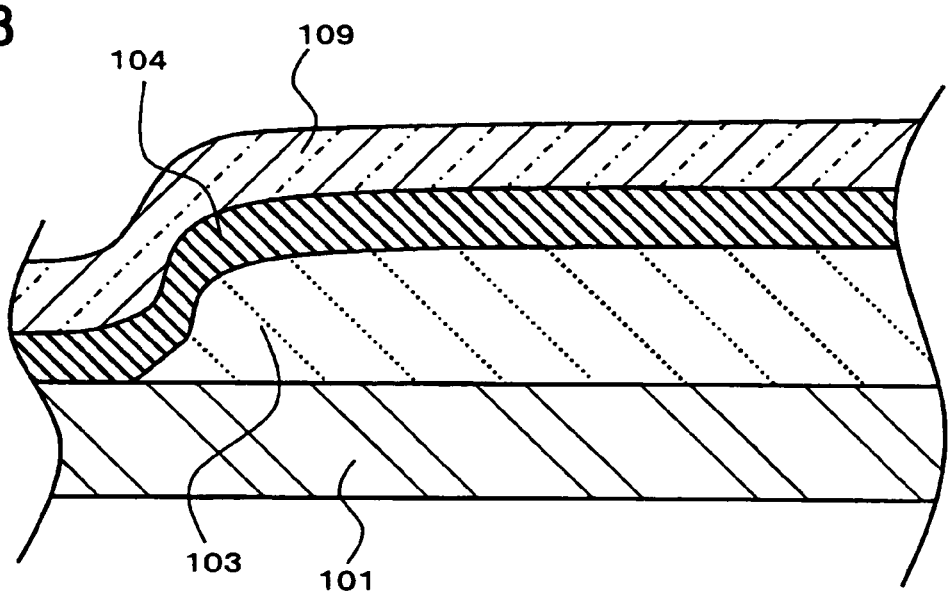

FIG. 4B is a cross-sectional view taken along the line A-A' of FIG. 3D. FIG. 4A shows a case wherein no protection pattern 109 is disposed, i.e., a case of the conventional organic EL display device 2. In the case of the conventional organic EL display device, the inorganic solid layer 204 is entirely exposed as shown in FIG. 4A. Areas of the exposed inorganic solid layer 204, which are located in particular at an edge region of the overcoat layer 203, are likely to be damaged by cleaning since such an area of the inorganic solid layer 204 is thinner. On the other hand, in the organic EL display device according to this embodiment, the inorganic solid layer 104 as well as its portions located in such thinner regions is covered with the protection patterns 109 as shown in FIG. 4B. Accordingly, it is possible to restrain the inorganic solid layer 104 from being damaged by cleaning.

Figure 3E:
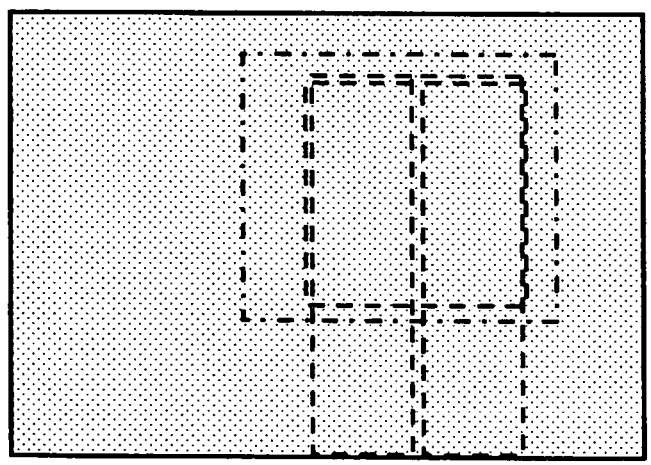
Figure 3F:
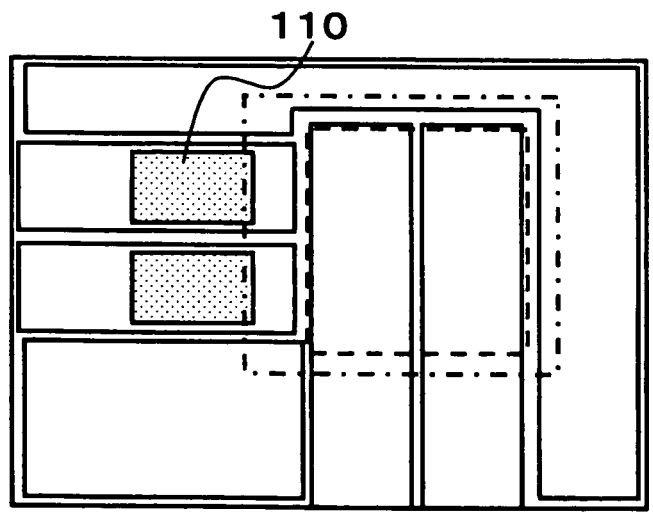

A metal film is deposited on the above-mentioned structure as shown in FIG. 3E, and the metal film is patterned to form connection wire 110 as shown in FIG. 3F (S106 of FIG. 7). After patterning, the substrate is cleaned (S107 of FIG. 7). Since this cleaning step is performed as in the cleaning step of S105 of FIG. 7, the provision of the protection patterns 109 can also prevent the inorganic solid layer 104 from being damaged by cleaning. As shown in FIG. 5G (S108 of FIG. 7), the insulating layer 106 having openings is disposed on the structure thus formed. In this embodiment, photosensitive polyimide is used to dispose the insulating layer by photolithography. Each of first openings 1061 shown in FIG. 5G is located at a portion where a cathode 108 disposed by a subsequent step and a transparent conductive layer 105 overlap each other so as to intersect from each other as viewed in a plan view, and each of the first openings 1061 functions as a pixel. Each of second openings 1062 is a contact hole for connecting a cathode 108 and a connection wire 110.

Separators 111 for forming the separated cathodes are patterned on the insulating layer as shown in FIG. 5H (S109 of FIG. 7). The separators 111 are formed in an inverted tapered shape, and the separators are disposed by using a cresol resin in this embodiment. Then, a drying step is performed in order to remove the moisture and/or the organic compound contained the organic material layers, such as the color filters 102, the overcoat layer 103 (S110 of FIG. 7), the insulating layer 106 (S108 of FIG. 7), and separators 111 (S109 of FIG. 7). For example, after deposition of the separators 111, the substrate is dried at 200° C. for one hour in vacuum, the substrate is further dried at 200° C. for 10 minutes in an atmosphere of dry nitrogen having the dew point of about −80° C. immediately before the next step, and the substrate is transferred into the next step without being exposed to the atmosphere. Thus, it is possible to remove moisture and/or organic compounds in the organic layers (102, 103, 106, 111), not only from the portions where organic layers are exposed but also through the exposed portions of the inorganic solid layer.

Then organic films 107 are disposed as shown in FIG. 5I (S111 of FIG. 7). For example, the organic films are made from a combination of 10 nm thickness of copper phthalocyanine, 100 nm thickness of α-NPD(4,4'-bis[N-(1-naphthyl)-N-phenylamino]biphenyl), and 60 nm thickness of Alq3 (tris(8-quinolinolato)aluminum) by vapor-deposition. The organic films 107 are disposed so as to cover at least the entire active area.

Then, the cathodes 108 are disposed on top of the substrate as shown in 6J (S112 of FIG. 7). For example, electron injection layers and the cathodes are made from a film of LiF having a thickness of 0.5 nm and Al electrodes having a film thickness of 80 nm by vapor-deposition, respectively. The vapor-deposition films are separated from one another by the separators 111 in an inverted tapered shape, and the vapor deposition films serve as the cathodes. The cathodes 108 overlap with anode wires comprising the transparent conductive layers 105 so as to intersect as viewed in a plan view. The insulating film 106 has each first opening 1061 formed at each of the intersecting portions. Accordingly, when an electric current flows through the organic film 107 at an intersecting portion, that portion serves as a light-emitting portion. Each light-emitting portion serves as a pixel. Then, the substrate is encapsulated at a region outside the overcoat layer area 103 by an encapsulation substrate 112 as shown in FIG. 6K (S113 of FIG. 7). Finally, the glass substrate is cut in a shape ready for mounting as shown in FIG. 6L (S114 of FIG. 7). A set of driving circuits is mounted to the glass substrate that has been cut in such a shape ready for mounting.

Figure 8:
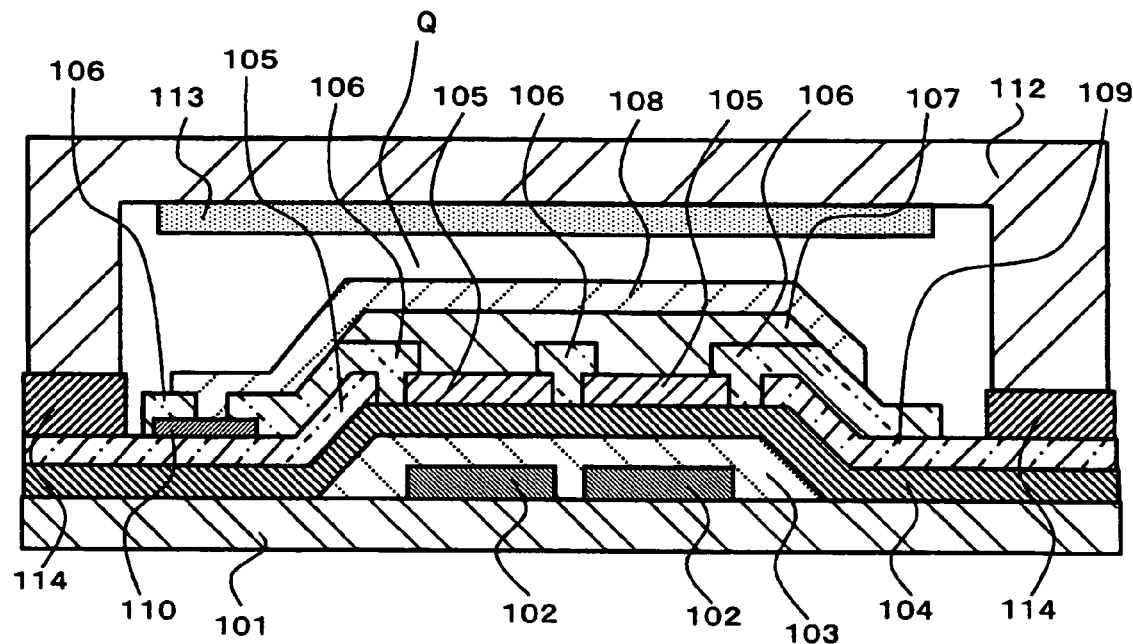
FIG. 8 is a cross-sectional view showing the organic EL display device according to the embodiment.
Figure 9:
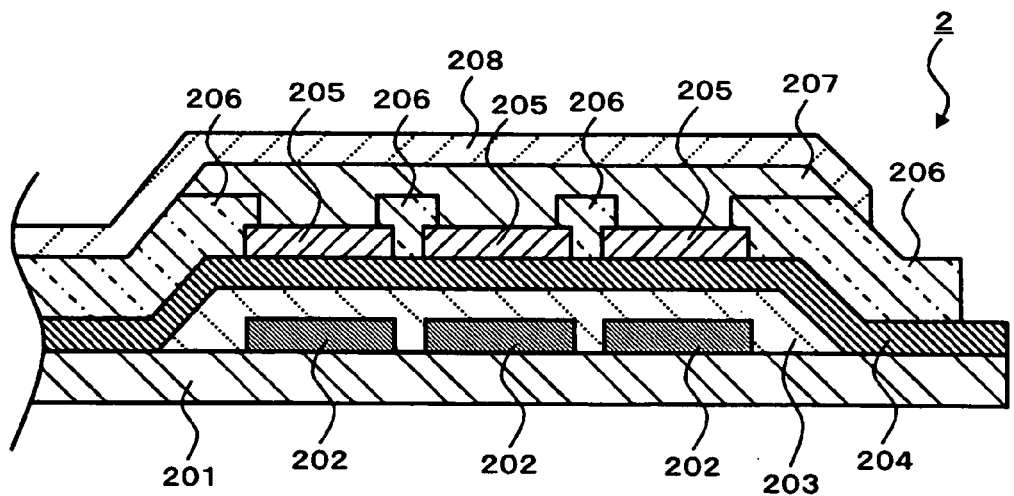
FIG. 9 is a cross-sectional view showing a conventional organic EL display device.
Figure 10:
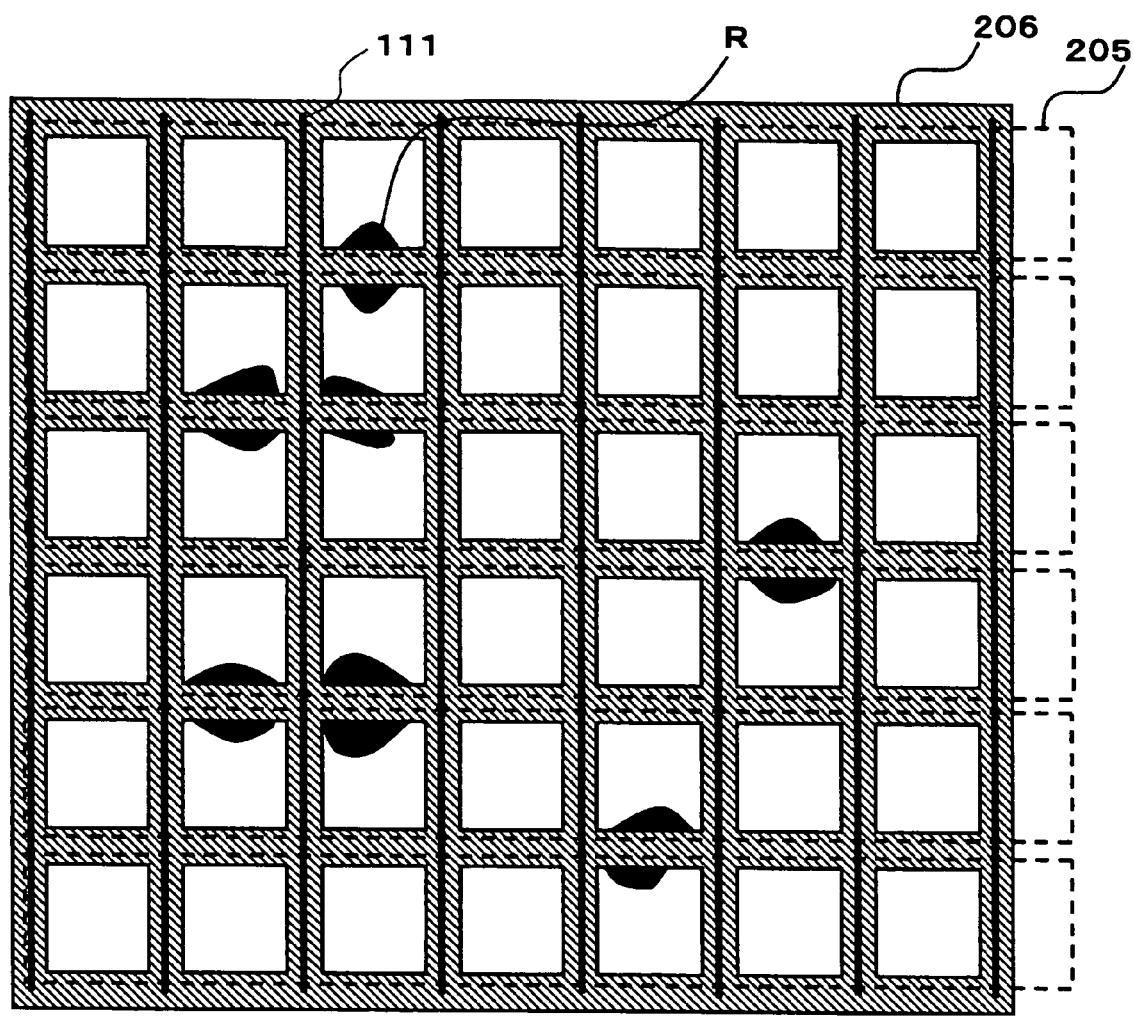
FIG. 10 is a schematic view showing the screen of the conventional organic EL display device.

FIG. 8 is a cross-sectional view of the organic EL display device taken along the line B-B' of FIG. 6L, wherein the encapsulation substrate 112 has been mounted. As shown in FIG. 8, each of the organic films 107 is sandwiched between the transparent conductive layers 105 and the corresponding cathode 108, and the cathode 108 is connected to the corresponding connection wire 110 through a contact hole formed in the insulating film 106. The encapsulation substrate 112 has a concaved portion formed by etching, and a desiccant 113 is disposed in the concave portion. The encapsulation substrate has a sealing material 114 at a portion thereof in contact with the glass substrate 101 to ensure adhesion and anti-permeability of moisture and gases. Dry gas, e.g. nitrogen gas is sealed in a space Q between the encapsulation substrate and the glass substrate. The encapsulation substrate 112 needs to be produced independently from the flow shown in FIG. 7. In this embodiment, the encapsulation substrate 112 is a glass substrate, and the desiccant 113 is a desiccant manufactured by SAES GETTERS INC. The concave shape of the encapsulation substrate 112 may be also formed by sandblast dry etching, wet-etching, or by forming melted glass in a desirable concave mold. The gas that is sealed in the space Q is not limited to dry nitrogen. It is acceptable to seal other dry gas, such as helium or argon.

As explained, the organic EL display device according to the first embodiment of the present invention can prevent the inorganic solid layer 104 from being damaged in the cleaning process in the fabrication process, improving yield and reducing failure caused with the lapse of time.

OTHER EMBODIMENTS

Although explanation of the first embodiment has been made about a color filter type organic EL display device, the present invention is not limited to this type of organic EL display device. The present invention is also applicable to, e.g., an CCM (color changing material) type of organic EL display device. In such a CCM type of organic EL display device, the organic films 107 are disposed by using an organic fluorescent material, which emits, e.g., blue-green light. In the structure shown in FIG. 1, color-converting layers for respectively converting the blue-violet light into red light and green light are disposed instead of the color filters 102 of R and G. And with color filter 102 of B, original blue-green light is modified to get desirable blue light. By this arrangement, the blue-green light from the organic films 107 is converted into light of the three primary colors of R and G. Then, light of R, G or B emits. Or at least a kind of color converting layer is disposed therebetween. Said color converting layer is capable of converting said original emitting light to a different color light and a white color is generated by mixing said different color and said original emitting light. It should be noted that an organic fluorescent material, which emits light in a color other than those colors, is used. It is also acceptable to use color filters in a color other than those colors or to use a CCM system.

Obviously, numerous modifications and variations of the present invention are possible in light of the above teachings. It is therefore to be understood that within the scope of the appended claims, the invention may be practiced otherwise than as specifically described herein.

The entire disclosure of Japanese Patent Application No. 2004-374720 filed on Dec. 24, 2004 including specification, claims, drawings and summary is incorporated herein by reference in its entirety.

What is claimed is:

1. An organic EL display device comprising:
   a substrate;
   a color organic material layer disposed on the substrate;
   an overcoat layer covering the color organic material layer;
   an inorganic solid layer disposed on the overcoat layer;
   a plurality of first electrodes, an organic light-emitting layer and a plurality of second electrodes disposed on the inorganic solid layer;
   a light-emitting portion, the light-emitting portion comprising a region of the organic light-emitting layer, where a first electrode and a second electrode overlap each other, and which is brought into contact with the first electrode and the second electrode;
   an insulting film disposed so as to cover both of edges of the first electrodes and all gaps between the first electrodes and adjacent ones thereof; and
   a protection layer disposed so as to cover an inorganic solid layer on the substrate as much as possible except areas of the first electrodes, the protection layer being patterned so as not to be short-circuited with the first electrodes when the protection layer comprises a conductive material.

2. The organic EL display device according to claim 1, wherein the protection layer is disposed outside an active area.

3. The organic EL display device according to claim 1, wherein the protection layer is conductive and is disposed so as to be insulated from the first electrodes.

4. The organic EL display device according to claim 1, wherein the protection layer is disposed so as to cover a whole region where the overcoat layer is disposed.

5. The organic EL display device according to claim 1, wherein the protection layer and the first electrodes are layers to be processed by the same processes.

6. The organic EL display device according to claim 1, wherein the organic light-emitting layer emits white light, and the color organic material layer comprises color filters of R, G and B.

7. The organic EL display device according to claim 1, wherein the organic light-emitting layer and the color organic material layer have at least a kind of color-converting layer disposed therebetween, said color-converting layer being capable of converting original emitting light to a different color light.

8. A method for fabricating an organic EL display device, comprising:
   disposing a color organic material layer on a substrate;
   disposing an overcoat layer so as to cover the color organic material layer;
   disposing an inorganic solid layer on top of the overcoat layer;
   disposing a plurality of first electrodes on the inorganic solid layer;
   disposing a protection layer on the inorganic solid layer and patterning the inorganic solid layer so as not to contact with the first electrodes;
   cleaning the substrate from above the first electrodes and the protection layer;
   disposing an insulating film on the first electrodes, the insulating film having openings;
   disposing an organic light-emitting layer; and
   disposing a plurality of second electrodes on the organic light-emitting layer disposed on the first electrodes.

9. The method according to claim 8, further comprising disposing the first electrodes and the protection layer by the same process.

10. The method according to claim 8, further comprising disposing separators to separate the second electrodes from one another.

* * * * *